United States Patent
Kuster

(10) Patent No.: US 6,170,641 B1
(45) Date of Patent: Jan. 9, 2001

(54) APPARATUS FOR TRANSPORTING THIN BOARDS, IN PARTICULAR PRINTED CIRCUIT BOARDS

(75) Inventor: Kaspar Kuster, Therwil (CH)

(73) Assignee: Vantico, Inc., Brewster, NY (US)

( * ) Notice: Under 35 U.S.C. 154(b), the term of this patent shall be extended for 0 days.

(21) Appl. No.: 09/303,584

(22) Filed: May 3, 1999

(30) Foreign Application Priority Data

Apr. 16, 1999 (DE) .................................................. 98108065

(51) Int. Cl.[7] .................................................. B65G 25/00
(52) U.S. Cl. .................................. 198/621.1; 198/468.2; 198/750.11; 414/226.02; 414/753.1
(58) Field of Search ............................ 198/468.2, 621.1, 198/750.11; 414/226.02, 753.1

(56) References Cited

U.S. PATENT DOCUMENTS

| | | | | |
|---|---|---|---|---|
| 3,077,259 | * | 2/1963 | Braun ................. | 198/621.1 |
| 3,771,669 | * | 11/1973 | Maggioni ............ | 198/621.1 |
| 4,273,507 | * | 6/1981 | Herdzina et al. ... | 414/226.02 |
| 4,621,516 | * | 11/1986 | Schafer et al. ..... | 198/621.1 |
| 4,785,657 | * | 11/1988 | Votava ................ | 198/621.1 |
| 5,667,351 | | 9/1997 | Tokairin et al. .... | 414/225 |
| 5,707,052 | | 1/1998 | Adams et al. ....... | 269/22 |

FOREIGN PATENT DOCUMENTS

| 4243252 | 7/1993 | (DE) . |
|---|---|---|
| 4339092 | 5/1995 | (DE) . |

OTHER PUBLICATIONS

Abstract for DE 4339092.
Abstract for DE 4243252.

* cited by examiner

Primary Examiner—Joseph E. Valenza
(74) Attorney, Agent, or Firm—David R. Crichton

(57) ABSTRACT

In an apparatus for transporting thin boards, in particular coated printed circuit boards, comprising rows of spaced-apart grippers (2) which lie opposite one another and are arranged on a rod (3), in order to prevent the thin boards from sagging when transported, tension is applied to a rod (3), at least on one side of the printed circuit board (1), by an elastic device (15, 20), in order to tension the printed circuit board which has been gripped.

8 Claims, 3 Drawing Sheets

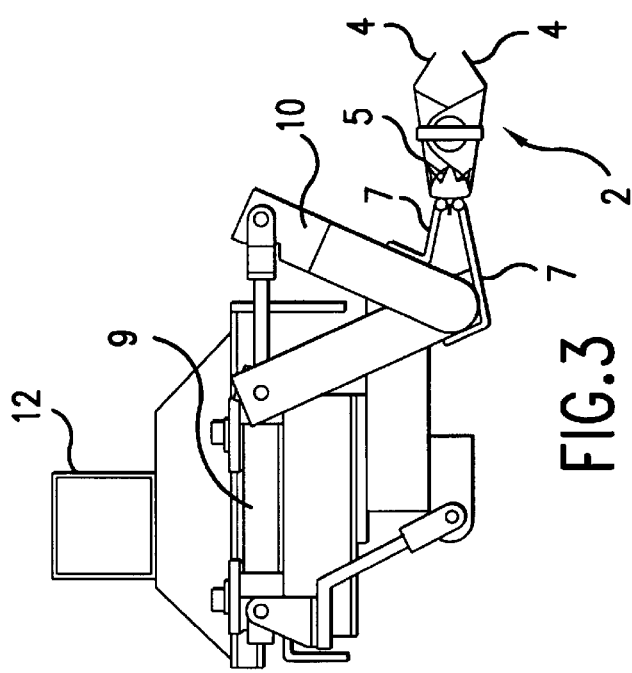
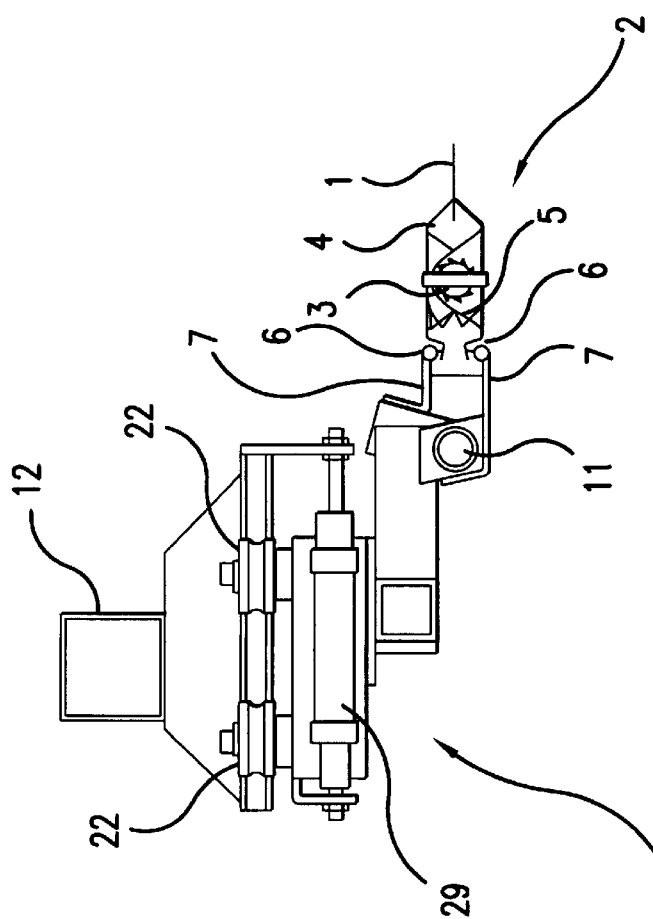

APPARATUS FOR TRANSPORTING THIN
BOARDS, IN PARTICULAR PRINTED
CIRCUIT BOARDS The invention relates to an apparatus for transporting thin boards, in particular very thin printed circuit boards, which are held between mutually opposite rows of grippers and are transported through various treatment zones.

U.S. Pat. No. 4,926,789 has disclosed a transport apparatus in which grippers take hold of the opposite, uncoated edges of a printed circuit board, after the grippers have first been opened by an actuating device, in order to receive a printed circuit board. This design is suitable for relatively rigid printed circuit boards which do not sag between the rows of grippers when transported, so that the coating which has been applied to the boards is not damaged. However, if very thin, film-like printed circuit boards are to be transported using such an apparatus, there is a risk of the thin printed circuit board sagging and as a result damaging the coating which has been previously applied by a casting device and is not yet solid.

The invention is based on the object of designing an apparatus of the type mentioned at the outset in such a way that it is suitable even for very thin, film-like printed circuit boards.

According to the invention, this object is achieved by the fact that at least one row of grippers is spring-loaded, so that in the gripping position the printed circuit board is held taut and cannot sag due to the tension applied.

The invention is explained in more detail, by way of example, with reference to the drawing, in which:

FIG. 2 shows a section on line B—B in FIG. 1, with a gripper in the gripping position;

FIG. 3 shows a section on line A—A in FIG. 1, with a gripper in the open position;

Figure 1:
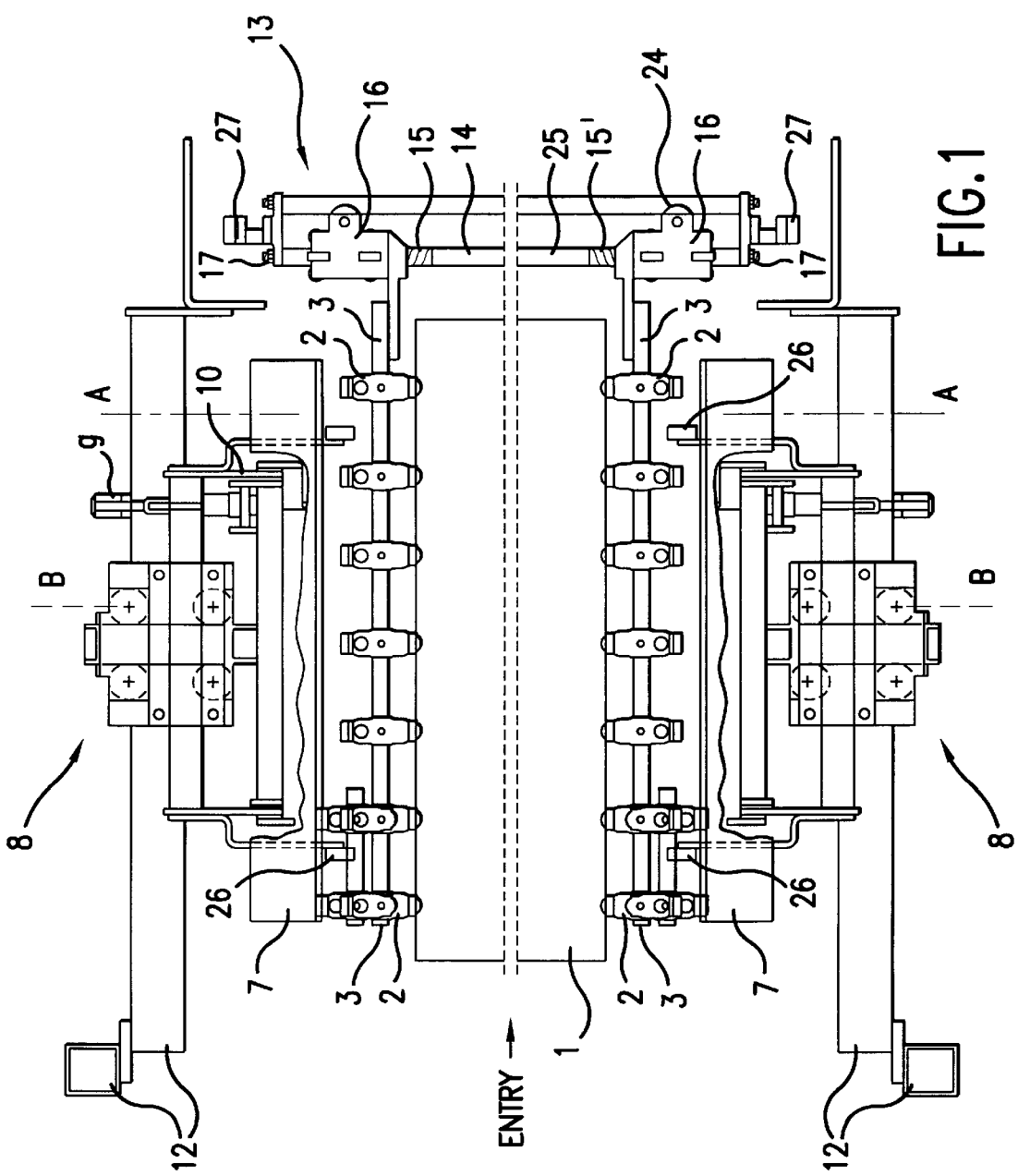
FIG. 1 shows a plan view of a transport apparatus with opposite rows of grippers.

In FIG. 1, 1 denotes a printed circuit board which has a thickness of, for example, 0.1 mm and is provided with a coating of an enamel on one or both sides, which coating was applied by a casting device (not shown) before the printed circuit board 1 was received in the apparatus illustrated, and following this application the board was introduced into the transport apparatus in the direction of the arrow, in order to be transported through a drying furnace and further treatment stations by means of this apparatus.

The mutually opposite, coating-free edges of the printed circuit board 1 are gripped by grippers 2, which are arranged at intervals on a rod 3 which may be designed as a threaded spindle, so that the individual grippers 2 can be moved by turning in the axial direction of the threaded spindle. FIGS. 2 and 3 respectively show a gripper 2 in the gripping position and in the open position. The grippers 2 may be designed in the manner of a clothes peg with gripper arms 4 which are spring-loaded towards the gripping position on one side of the central articulation point by means of a spring 5. However, other embodiments of the grippers 2 are also possible.

In the exemplary embodiment illustrated, the gripper arms 4 are provided with angled-off extensions 6 on the outer side, against which actuating jaws 7 of an actuating device 8 come to bear when, for example, an actuating cylinder 9 pivots a lever 10, by means of which the two jaws 7 are pressed together, in order to press together the actuating extensions 6 of a gripper 2 and to open the gripper ends, as shown in FIG. 3.

As shown by the plan view illustrated in FIG. 1, the actuating jaws 7 of the actuating device 8 are of elongate design, so that all the grippers 2 in a row can be actuated simultaneously. 11 denotes the pin about which the levers 10 can pivot. The actuating devices 8 on both sides of the printed circuit board 1 are arranged on a stationary frame which is diagrammatically indicated at 12, it being possible to displace a part which supports the jaws 7 transversely with respect to the printed circuit board 1, for example by means of pneumatic cylinders, over rolls 22 on a fixed guide 23.

In the embodiment shown in FIG. 1, a tensioning device 13 acts on the mutually opposite rods 3, which support the grippers 2, at the opposite end from the entry side, which tensioning device has a guide bar 14 which is transverse with respect to the rods 3 and on which springs 15, 15' are arranged, which each act on a carriage 16, which is connected to the end of the rod 3, in such a way that the two rods 3 are forced apart. On the entry side, two grippers 2 are shown in the inactive position, in which the rods 3 lie at a greater distance from one another and are pressed apart by the springs 15, 15' via the carriages 16, which in this position may bear against a stop 17 of the tensioning device 13.

When the grippers 2 are open, a printed circuit board 1 is introduced between the rods 3 by means of a device which is not shown, and then the rods 3 are moved together, counter to the force of the springs 15, 15', by stops 26 on the actuating devices 8 and the grippers 2 which are being held open by the devices, until the gripper ends of the gripper arms 4 lie in the area of the enamel-free edge of the printed circuit board 1. The actuating jaws 7 are then moved apart by pivoting back the lever 10 of the actuating device 8, so that the gripper ends are brought to bear on the printed circuit board 1 by the spring 5. Then, the actuating device 8 is moved back outwards, so that the grippers 2 are exposed, as shown in FIG. 1, the stops 26 lying at a distance from the rods 3. After the grippers 2 have taken hold of the board 1, the rods 3 are thus pressed apart by the force of the springs 15, 15', via the carriages 16, with the result that the printed circuit board 1 is held taut between the grippers 2.

The carriages 16 can be displaced along a guide rod 25 by means of rolls 24 and may also be provided with an additional adjustment device.

After, in the embodiment in accordance with FIG. 1, the rods 3 have been pressed apart at only one end by the carriages 16, while the ends of the rods 3 on the entry side are exposed, the two rods 3 in the inactive position are arranged at a slight angle with respect to one another, so that their ends on the entry side lie slightly further apart than the ends on the side of the tensioning device 13. When the actuating devices 8 are moved together, the stop 26 presses the rod 3 on the entry side together in such a manner that the two rods 3 are pressed out of the inclined position referred to above until they are parallel to one another, and are then moved towards one another. After a board 1 has been received between the grippers of the rods 3 which have been arranged parallel in this way, the stop 26 is detached from the associated rod 3 by the actuating device 8 being retracted, so that this rod 3 can spring back outwards again, and in this way a prestress is also applied to the board 1 on the entry side, while on the side of the tensioning device 13 the springs 15, 15' press the two carriages 16 apart.

After the printed circuit board 1 has been clamped in, the transport apparatus in accordance with FIG. 1, together with the tensioning device 13, is moved, by a conveyor device acting at 27, for example a chain, to a treatment station, for example into a furnace for venting and drying, into a cooling station and the like, the printed circuit boards 1 being held in a horizontal plane by the tension applied by means of the spring-loaded grippers 2, so that the coating, which is initially still liquid or soft, does not experience the damage which would occur if the printed circuit boards 1 were to sag.

Figure 5:
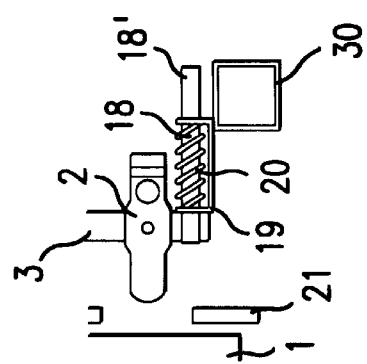
FIG. 5 shows a plan view of a gripper in the retracted position, with tensioning device.
Figure 6:
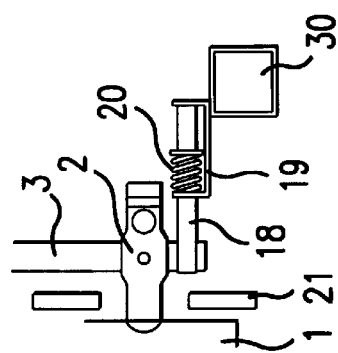
FIG. 6 shows a similar view of the gripper in the gripping position.
Figure 4:
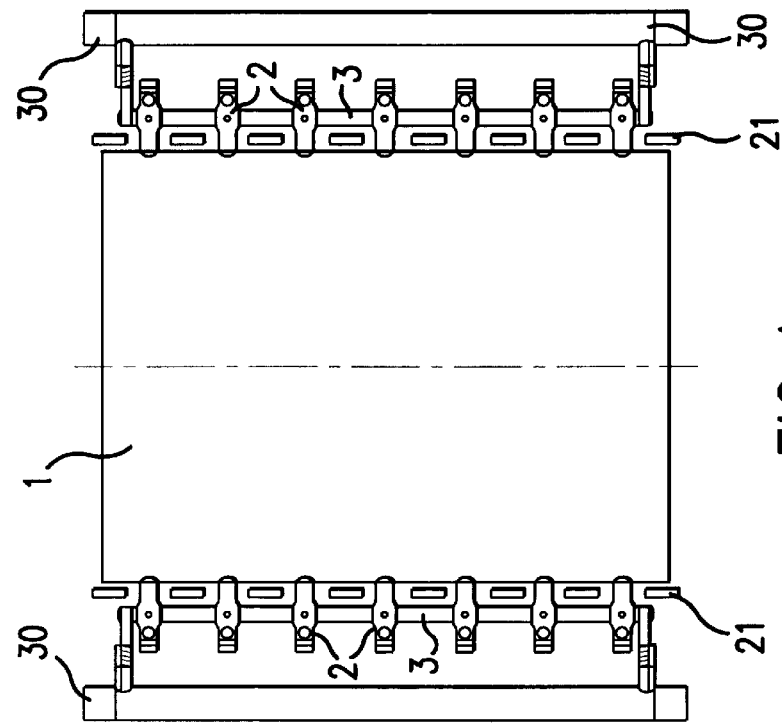
FIG. 4 shows a plan view of another embodiment of the transport apparatus.

FIG. 4 shows a plan view of another embodiment of the transport apparatus in a transport frame 30 made from square pipes, the mutually opposite rods 3 being spring-loaded at both ends. For this purpose, the ends of the rods are connected to a ram 18 which projects approximately at right angles and is guided displaceably in a guide 19, which may, for example, be designed as a U-rail which is secured in the transport frame 30 and has spaced-apart holes for accommodating the rams 18 which are arranged above one another. Inside the guide 19, a spring 20, which bears against a collar of the ram and against the guide 19, acts on the ram 18 in such a manner that the ram 18, together with the rod 3, is pressed outwards in FIG. 4. FIG. 5 shows the ram 18 in the inactive position with gripper 2 retracted. FIG. 6 shows the ram 18 with the gripper 2 in the gripping position on the edge of a printed circuit board 1, the rod 3 which supports the gripper 2 being pressed outwards by the spring 20 in order to hold the printed circuit board 1 taut.

For the sake of clarity of the drawing, the actuating device 8 for the grippers 2 is not shown in FIG. 4. By way of the actuating device 8, the rods 3 with grippers 2 are moved into the gripping position counter to the force of the springs 20, by means of the stops 26 (FIG. 1), and then, after the edge of the printed circuit board 1 has been taken hold of by the grippers 2, the actuating device 8 is retracted, so that the rods 3, with the grippers 2, are then tensioned only by the springs 20.

In FIG. 4, 21 furthermore indicates, purely diagrammatically, extended gripper elements by means of which a printed circuit board 1 is transferred from a casting device for applying the coating into the transport apparatus in accordance with FIG. 4.

The same actuating device 8 as that illustrated in FIGS. 2 and 3 can be used in the apparatus in accordance with FIG. 4 to displace the rods 3 with grippers 2. For the horizontal movement, two different, separate paths are followed in the horizontal direction, for example by means of two pneumatic cylinders. After the first displacement path, the actuating device 8 is positioned with the jaws 7 at the position where the grippers 2 can be taken hold of and opened, as illustrated in FIGS. 5 and 2. After the grippers have been opened by pressing the actuating extensions 6 together (FIG. 3) by means of the jaws 7, the grippers 2, together with the rods 3, are displaced towards the printed circuit board 1, via the stops 26, by means of the second displacement drive, for example in the form of a pneumatic cylinder, e.g. 29 in FIG. 2. When the limit position of a gripper, as illustrated in FIG. 6, has been reached, the actuating device 8 opens the jaws 7, so that the grippers 2 are clamped firmly to the edge of the printed circuit board 1. The actuating device 8 is retracted, so that the grippers 2 are tensioned by the springs 20 in the embodiment in accordance with FIG. 4, and thus the printed circuit board 1 is also tensioned. Before the entire transport frame 30, with the fitted rods 3 and grippers 2, is raised upwards in FIG. 7 by one cycle by means of a lifting device (not shown), the laterally arranged actuating devices 8 are moved out into the normal position in which they do not impede lifting of the transport frame.

Figure 7:
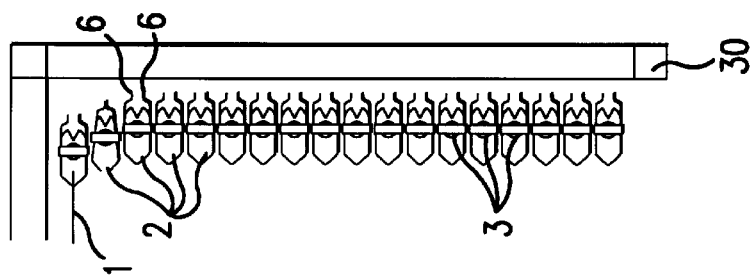
FIG. 7 shows an end view of half of the apparatus in accordance with FIG. 4.

FIG. 7 shows an end view of the right-hand side of the apparatus in accordance with FIG. 4 with a number of rows of grippers which are arranged above one another in the transport frame 12, which is moved cyclically, for example upwards, by means of the lifting device (not shown), in order to successively insert a printed circuit board 1, which arrives at a predetermined level from the coating device, into the individual rows of grippers. In FIG. 7, the top gripper 2 is shown in the position in which it grips a printed circuit board 1, while the gripper below it is shown in the open position, into which it is moved, in accordance with FIG. 3, by the actuating device 8 (not shown), after which the open gripper is advanced onto the next printed circuit board 1 supplied in the position which the top gripper currently holds. After the gripper has been closed, the actuating device 8 is retracted, in order to act on the third gripper after a further cycle movement of the transport frame in the upwards direction. In FIG. 7, this third gripper, together with the other grippers, is in the inactive position, in which the actuating device 8 is not acting on them. In the illustration shown in FIG. 7, the second gripper from the top is situated at the level of the actuating device 8.

FIGS. 1 and 4 each show an embodiment in which the mutually opposite rows of grippers are pressed apart outwards by an elastic device, such as for example the springs 15 and 20. It is also possible to use an embodiment in which the grippers 2 are.arranged fixedly on one side of the printed circuit board 1, while only the grippers on the opposite side are pretensioned in the tensioning direction. In this case too, the result is a stress on the printed circuit board 1 which holds this board in a plane and prevents it from sagging even if the printed circuit board 1 is of film-like design.

What is claimed is:

1. Apparatus for transporting thin boards, in particular coated printed circuit boards, having rows of spaced-apart grippers (2), which rows lie opposite one another, wherein the grippers are arranged on a rod (3) and at least on one side of the printed circuit board (1) a tension can act upon a rod (3) by means of an elastic device (15, 20), in order to tension the printed circuit board which has been gripped.

2. Apparatus according to claim 1, in which a tensioning device (13) acts on at least one end of the rod (3).

3. Apparatus according to claim 1, in which a tensioning device (18, 20) is provided at each end of the rod (3) which supports the grippers (2).

4. Apparatus according to claim 3, in which the tensioning device has rams (18) which are arranged at the ends of the rods (3) and are guided in a guide (19) and on which at least one spring (20) acts in the tensioning direction.

5. Apparatus according to claim 4, in which the tensioning device (18–20) with rods (3) is arranged in a transport frame (30), in which the printed circuit boards (1) can be moved through various treatment stations, such as for example for venting, drying, stoving and cooling, without being unloaded and reloaded.

6. Apparatus according to claim 1, in which an actuating device (8) having a part which can be moved in a stepwise manner by a drive device is provided, which part is equipped with actuating jaws (7) for simultaneously actuating the grippers (2) arranged on a rod (3).

7. Apparatus according to claim 6, in which the actuating jaws (7) of the actuating device (8) come to bear against the free ends (6) of the grippers (2), which are designed in the manner of a clothes peg.

8. Apparatus according to claim 6, in which stops (26) for displacing the rods (3) into the gripping position are arranged on the actuating device (8).

* * * * *

UNITED STATES PATENT AND TRADEMARK OFFICE
CERTIFICATE OF CORRECTION

| | |
|---|---|
| PATENT NO. : 6,170,641 | |
| DATED : January 9, 2000 | |
| INVENTOR(S) : Kaspar Kuster | |

It is certified that error appears in the above-identified patent and that said Letters Patent is hereby corrected as shown below:

Title page,
Section [30] should read:
-- [30] Foreign Application Priority Data
    May 4, 1998   [EPO]   Europe   98108065.8 --.

Signed and Sealed this

Tenth Day of July, 2001

*Attest:*

NICHOLAS P. GODICI
*Attesting Officer*   *Acting Director of the United States Patent and Trademark Office*